(12) United States Patent
Farnworth et al.

(10) Patent No.: US 6,258,609 B1
(45) Date of Patent: Jul. 10, 2001

(54) METHOD AND SYSTEM FOR MAKING KNOWN GOOD SEMICONDUCTOR DICE

(75) Inventors: Warren M. Farnworth, Nampa; Alan G. Wood, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/719,850

(22) Filed: Sep. 30, 1996

(51) Int. Cl.⁷ .................. H01L 21/66; G01R 31/26
(52) U.S. Cl. .................. 438/14; 438/15; 438/17; 324/755; 324/765; 324/537
(58) Field of Search .................. 438/14, 15, 16, 438/17, 18, 131, 132; 324/755, 754, 757, 765, 537

(56) References Cited

U.S. PATENT DOCUMENTS

| | | | |
|---|---|---|---|
| 4,064,493 | 12/1977 | Davis | 365/96 |
| 4,419,747 | 12/1983 | Jordan | 365/201 |
| 4,899,107 | 2/1990 | Corbett et al. | 324/158 F |
| 4,918,692 | * 4/1990 | Hidaka et al. | 371/2.2 |
| 5,058,059 | 10/1991 | Matsuo et al. | 365/96 |
| 5,106,773 | 4/1992 | Chen et al. | 437/51 |
| 5,110,754 | 5/1992 | Lowrey et al. | 437/52 |
| 5,119,163 | 6/1992 | Ishihara et al. | 357/51 |
| 5,140,554 | 8/1992 | Schreck et al. | 365/201 |
| 5,302,891 | 4/1994 | Wood et al. | 324/158 |
| 5,324,681 | 6/1994 | Lowrey et al. | 437/52 |
| 5,367,253 | 11/1994 | Wood et al. | 324/158.1 |
| 5,387,823 | * 2/1995 | Ashizawa | 365/200 |
| 5,408,190 | 4/1995 | Wood et al. | 324/765 |
| 5,424,652 | 6/1995 | Hembree et al. | 324/765 |
| 5,440,240 | 8/1995 | Wood et al. | 324/765 |
| 5,451,165 | 9/1995 | Cearley-Cabbiness et al. | 493/71 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,519,332 | 5/1996 | Wood et al. | 324/755 |
| 5,523,697 | 6/1996 | Farnworth et al. | 324/758 |
| 5,530,376 | 6/1996 | Lim et al. | 324/765 |
| 5,539,324 | 7/1996 | Wood et al. | 324/758 |
| 5,541,525 | 7/1996 | Wood et al. | 324/755 |
| 5,543,725 | 8/1996 | Lim et al. | 324/755 |
| 5,578,934 | 11/1996 | Wood et al. | 324/758 |
| 5,592,736 | 1/1997 | Akram et al. | 29/842 |
| 5,634,267 | 6/1997 | Farnworth et al. | 29/840 |
| 5,678,301 | 10/1997 | Gochnour et al. | 29/827 |
| 5,764,574 | * 6/1998 | Nevill et al. | 365/200 |
| 5,768,290 | * 6/1998 | Akamatsu | 371/22.4 |
| 5,796,264 | 8/1998 | Farnworth et al. | 324/758 |
| 5,815,000 | 9/1998 | Farnworth et al. | 324/755 |
| 5,844,418 | 12/1998 | Wood et al. | 324/755 |

\* cited by examiner

Primary Examiner—Kevin M. Picardat
(74) Attorney, Agent, or Firm—Stephen A. Gratton

(57) ABSTRACT

A method and system for making known good semiconductor dice are provided. The method includes providing a semiconductor die with programmable links, such as fuses or anti-fuses, that permit defects on the die to be corrected during a testing procedure. The system includes a testing apparatus in electrical communication with testing circuitry and with programming circuitry. During the testing procedure defects on the die can be detected and then corrected by selective actuation of the programmable links. Once the defects have been corrected the rehabilitated die can be retested and reburned-in, if necessary, for certification as a known good die. In an illustrative embodiment, the testing apparatus is adapted to electrically connect to multiple dice individually packaged in temporary packages. In an alternate embodiment, the testing apparatus comprises a board adapted to electrically connect to multiple unpackaged dice. In another alternate embodiment the testing apparatus comprises a board adapted to electrically connect to a semiconductor wafer comprising a plurality of dice.

60 Claims, 7 Drawing Sheets

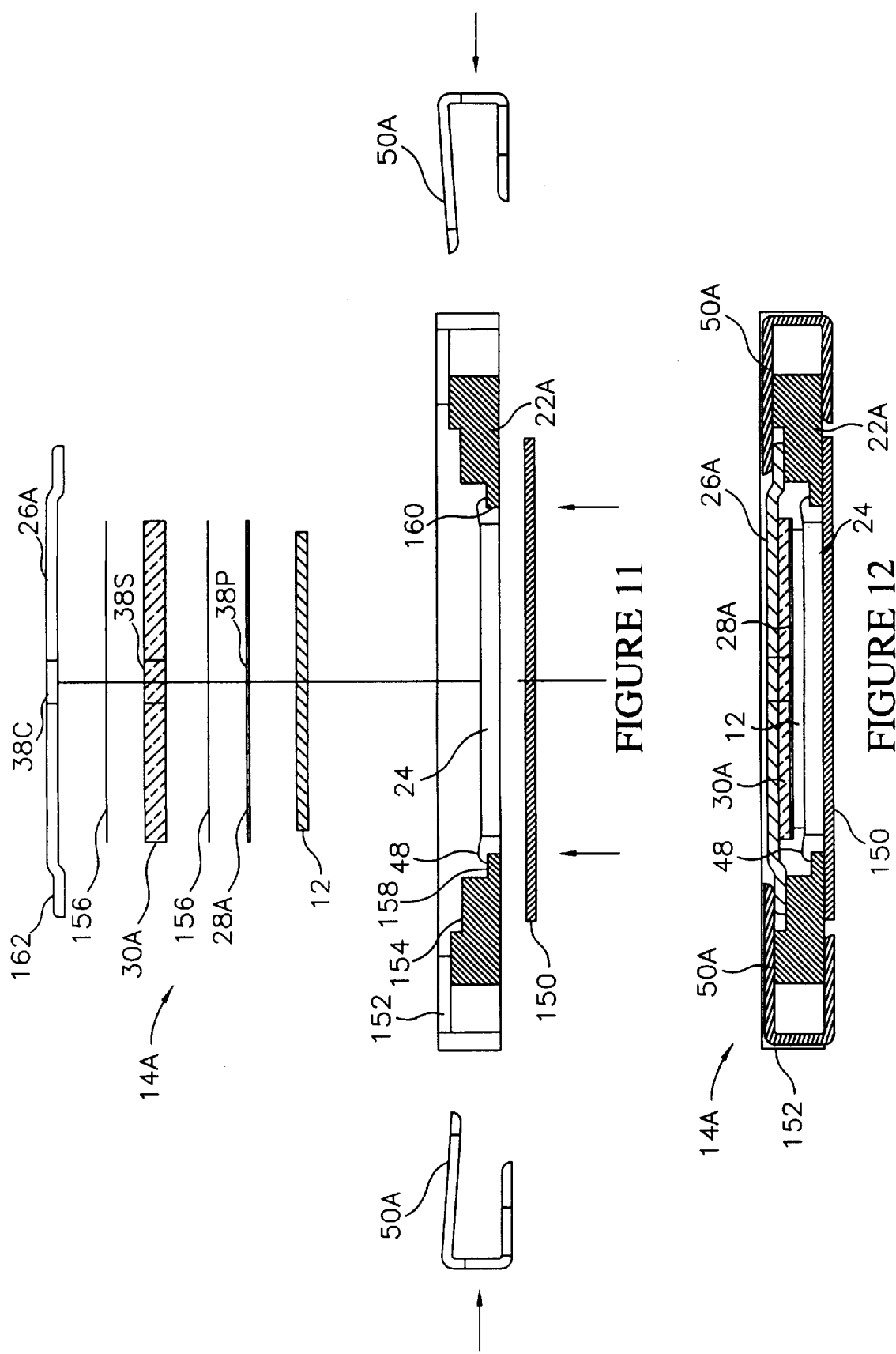

METHOD AND SYSTEM FOR MAKING KNOWN GOOD SEMICONDUCTOR DICE

FIELD OF THE INVENTION

This invention relates generally to semiconductor manufacture and more particularly to an improved method and system for making known good semiconductor dice by correcting defects in the dice during a testing procedure.

BACKGROUND OF THE INVENTION

Semiconductor dice must be tested during the manufacturing process to insure the reliability and performance characteristics of the integrated circuits on the dice. Accordingly, different testing procedures have been developed by semiconductor manufacturers for testing semiconductor dice. Standard tests for gross functionality are typically performed by probe testing the dice at the wafer level. Probe testing at the wafer level can also be used to rate the speed grades of the dice. Burn-in testing is typically performed after the dice have been packaged. During burn-in testing the packaged dice are subjected to elevated temperatures for extended periods of time while different electrical parameters of the integrated circuits are evaluated.

In addition to conventional plastic or ceramic semiconductor packages, semiconductor dice are also made in an unpackaged or bare form. A known good die (KGD) is a bare die that has been tested to insure a quality and reliability equal to a conventionally packaged product. For testing bare semiconductor dice, semiconductor manufacturers have developed specialized testing apparatus, such as carriers adapted to retain a single bare die for burn-in and other test procedures.

Bare dice that do not pass a test procedure are typically discarded by the manufacturer. Discarding defective dice decreases the yield of the known good die manufacturing process and adds to the expense of the dice. It would be advantageous to provide a test repair procedure that also increases the yield in the manufacture of known good dice.

SUMMARY OF THE INVENTION

In accordance with the invention, a method and system for making known good semiconductor dice are provided. The method, simply stated, comprises correcting defective dice during a testing process using programmable links formed on the dice. The programmable links comprise fuses or anti-fuses, in electrical communication with integrated circuits formed on the dice. Upon detection of a defect in a die, the programmable links on the die can be used to activate redundant integrated circuitry, or to program different operational modes to correct the defect. Following defect correction, rehabilitated dice can be tested and burned-in a second time, to insure their reliability as known good dice. Alternately, redundant circuitry on the dice can be constructed for test and burn-in during the initial testing process, such that a second test and burn-in are not required.

The system can include a testing apparatus adapted to simultaneously test multiple dice in singulated or wafer form. The testing apparatus includes, or is in electrical communication with testing circuitry and with programming circuitry. The testing circuitry is adapted to apply test signals to the dice to identify defects. The programming circuitry is adapted to apply programming signals to the programmable links to correct the defects.

For testing and repairing singulated dice, each die can be held in a temporary package and mounted to the testing apparatus. The temporary package can include a base for retaining the die, an interconnect for establishing temporary electrical communication with the die, and a force applying mechanism for biasing the die against the interconnect.

To practice the method with singulated dice, semiconductor dice are fabricated or provided with programmable links and redundant, or programmable, integrated circuitry. The dice can be bare dice, bumped dice or chip scale packages. Following the fabrication process each die can be assembled in a temporary package for testing and defect correction. After assembly, the temporary packages can be placed on the testing apparatus, in electrical communication with the testing and programming circuitry. Initially, different tests including burn-in tests can be conducted to locate defects in the dice. With the dice still housed in the temporary packages, defects identified during testing can be corrected by selective actuation of the programmable links on the defective dice.

In an alternate embodiment, the singulated dice are not packaged in temporary packages. Rather, the testing apparatus is formed as a board adapted to retain multiple bare dice in electrical communication with testing and programming circuitry. Interconnects mounted to the board establish temporary electrical communication between the dice and the testing and programming circuitry. In addition, force applying mechanisms attachable to the board bias the dice against the interconnects.

In another alternate embodiment a wafer testing system is adapted to test and repair dice contained on a wafer. The system can include a wafer interconnect for establishing temporary electrical communication with each die contained on the wafer, and a force applying member for biasing the wafer against the wafer interconnect. The wafer interconnect can comprises a board configured to test one or more wafers or can be mounted in a housing configured to retain a single wafer.

BRIEF DESCRIPTION OF THE DRAWINGS

FIG. 11 is an enlarged exploded view of an alternate embodiment temporary package suitable for use in making known good semiconductor dice in accordance with the invention; and FIG. 12 is a cross sectional view, equivalent to FIG. 3, illustrating the assembled alternate embodiment temporary package.

DETAILED DESCRIPTION OF THE PREFERRED EMBODIMENTS

Figure 1:
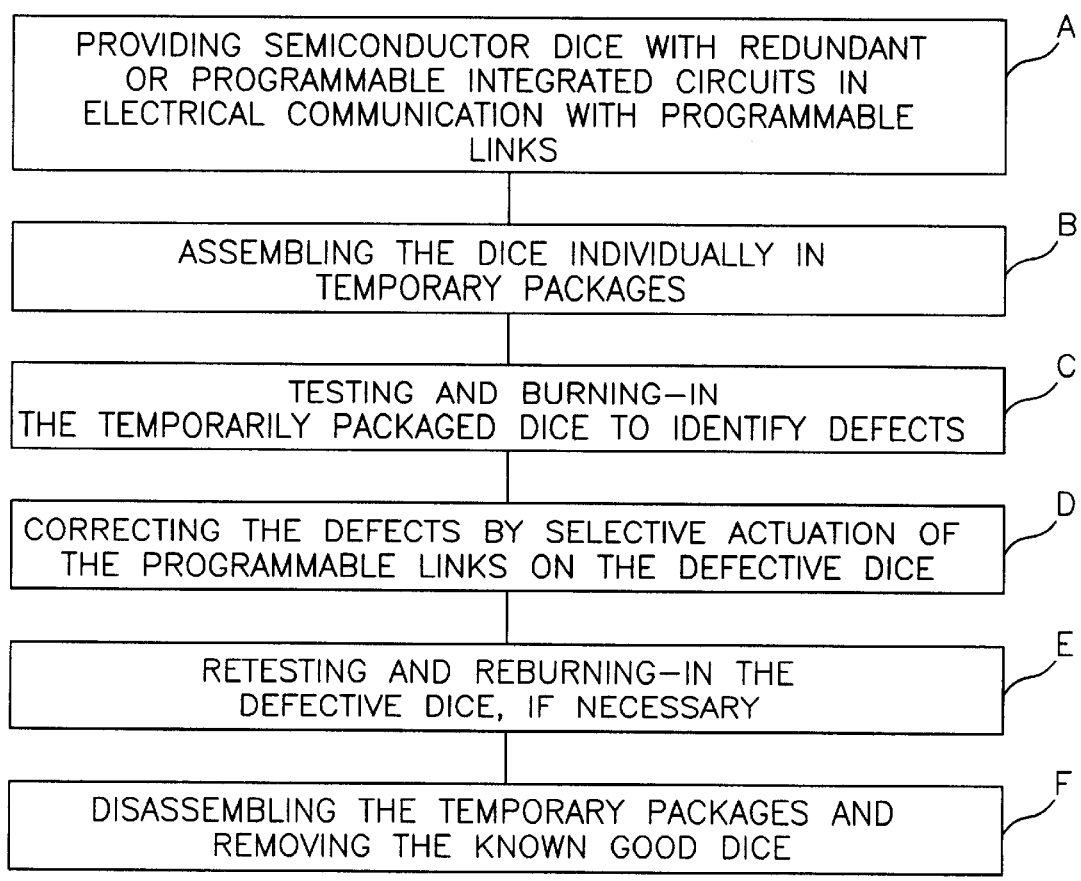
FIG. 1 is a diagram of the broad steps in a method for making known good semiconductor dice in accordance with the invention.

Referring to FIG. 1, broad steps in a method for making known good semiconductor dice in accordance with the invention are shown. In an illustrative embodiment, the method, broadly stated, includes the steps of:

providing semiconductor dice with redundant or programmable integrated circuits in electrical communication with programmable links, step A;

assembling the dice individually in temporary packages, step B;

testing and burning-in the temporarily packaged dice to identify defects, step C;

correcting the defects by selective actuation of the programmable links on the defective dice, step D;

retesting and reburning-in the defective dice, if required, step E; and disassembling the temporary packages and removing the known good dice, step F.

Figure 2:
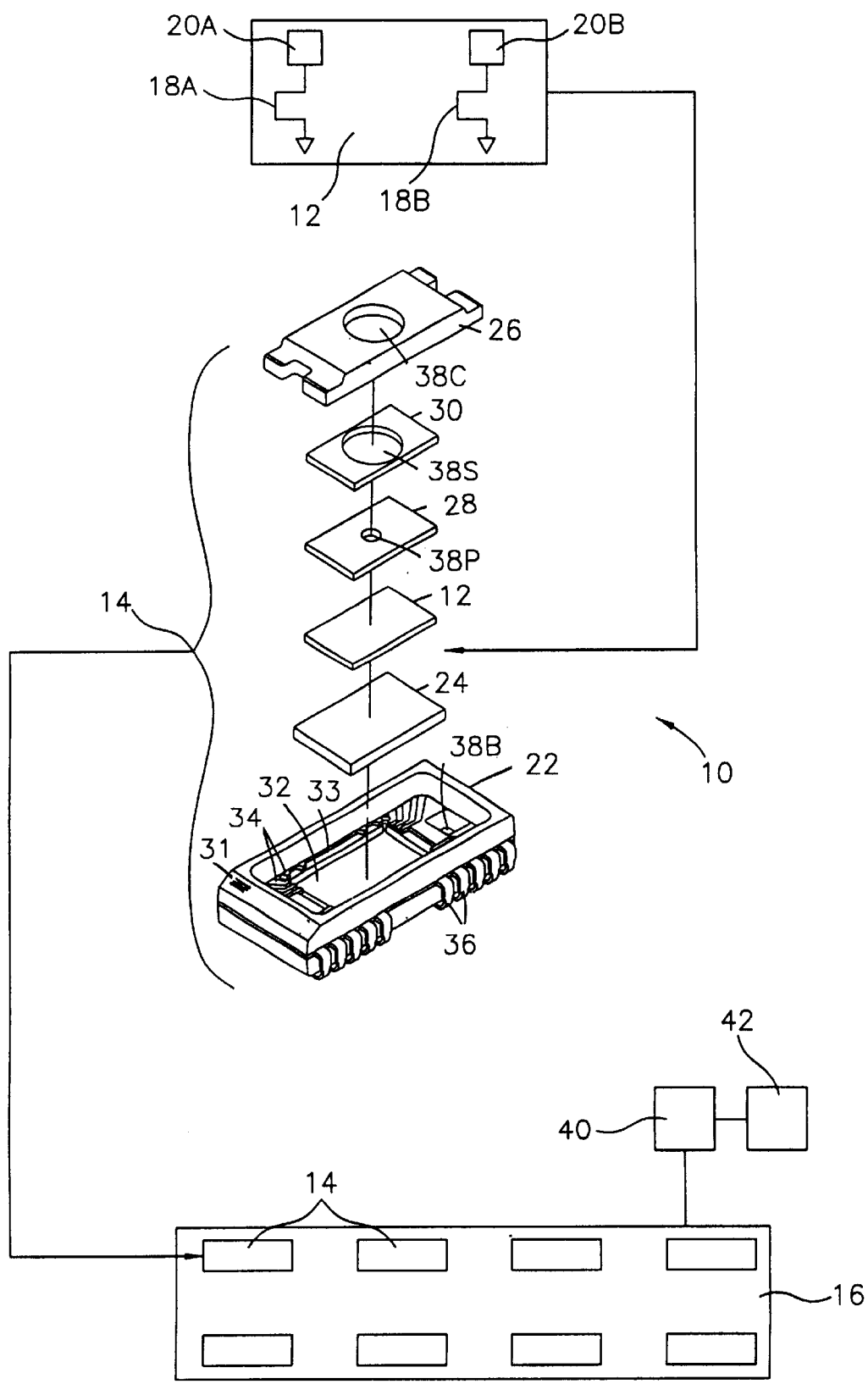
FIG. 2 is a schematic drawing of a system for making known good semiconductor dice in accordance with the invention.

Referring to FIG. 2, a system 10 for making known good semiconductor dice in accordance with the above outlined method is shown. The system 10 includes a semiconductor die 12; a temporary package 14 for the die 12; and a testing apparatus 16 for testing and correcting defects in the die 12.

The semiconductor die 12 can be formed using processes that are known in the art. The semiconductor die 12 can be a bare die, a bumped bare die or a chip scale package. As used herein, a bare die is a singulated unpackaged die having flat bond pads. A bumped bare die is a singulated unpackaged die having bond pads formed with a bump. A chip scale package is a singulated die having a thin protective cover formed of glass or other materials bonded to at least the face of the die. An outline of a chip scale package is substantially equivalent to that of the bare die.

The semiconductor die 12 includes a programmable link 18A and a programmable link 18B. Programmable link 18A is in electrical communication with integrated circuits 20A formed on the die 12. Programmable link 18B is in electrical communication with integrated circuits 20B formed on the die 12. The semiconductor die 12 also includes address circuitry (not shown) for uniquely addressing each programmable link 18A, 18B.

The programmable links 18A and 18B can be formed as fuses or anti-fuses. Each of these types of programmable links are well known structures that can be formed using known processes.

Fuses are typically formed of a material such as a titanium tungsten alloy shaped in a bow-tie like configuration (i.e., narrow body, wide ends). If a sufficiently high voltage is applied to a fuse, the current flow will cause the fuse to heat up. This melts the neck of the fuse and causes the fuse to blow and create an open circuit.

An anti-fuse, instead of causing an open circuit, creates a short circuit or low resistance link. Anti-fuses typically include a pair of conductors having some type of dielectric or insulating material between them. The application of a predetermined voltage to the anti-fuse will break down the dielectric material and electrically connect the conductors together. Exemplary anti fuses that are programmable by application of a voltage are disclosed in U.S. Pat. Nos. 5,324,681 and 5,110,754 to Lowrey et al., incorporated herein by reference.

The programmable links 18A, 18B and integrated circuits 20A, 20B can be configured to provide a defect correction capability for the die 12. For example, programmable link 18A can be a fuse and integrated circuits 20A can be a memory cell array. Programmable link 18B can be an anti-fuse and integrated circuits 20B can be a redundant memory cell array. If the integrated circuits 20A are ascertained to be defective during a subsequent test procedure, the programmable link 18A can be blown to disable integrated circuits 20A, and the programmable link 18B can be actuated to activate redundant integrated circuits 20B.

As apparent other correctable circuit arrangements can be employed. As an example, the programmable links 18A, 18B can be located in the decoding integrated circuitry for the die 12, to redirect signals to or from different functional locations.

Still referring to FIG. 2, the die 12 is formed, or provided, in its completed form and then assembled in the temporary package 14 for testing and burn-in. In the illustrative embodiment, the assembled temporary package 14 has an outline that is substantially equivalent to a conventional ceramic or plastic semiconductor package. However, it is to be understood that the invention can be practiced with other types of temporary packages or alternately without temporary packages.

The temporary package 14 includes: a base 22 for retaining the die 12; an interconnect 24 for establishing temporary electrical communication with the die 12; and a force applying mechanism in the form of a cover 26, a pressure plate 28 and a spring member 30 for biasing the die 12 against the interconnect 24. The cover 26, pressure plate 28 and spring member 30 include openings 38C, 38P, 38S that permit a vacuum assembly tool (not shown) to manipulate the die 12 and assemble the temporary package 14 during the assembly procedure.

During this assembly procedure, the vacuum assembly tool aligns the die 12 with the interconnect 24 and attaches the force applying mechanism to the package base 22. As will be further explained, optical alignment techniques can be used to align the die 12 with the interconnect 24. The temporary package 14 can also include indicia 31 such as a bar code that allows the die 12 to be tracked during the testing procedure.

The interconnect 24 mounts to a surface 32 formed within a recess 33 in the base 22. The base 22 includes internal conductors 34 in electrical communication with terminal contacts 36 formed on the base 22. The base 22 and terminal contacts 36 can be equivalent in shape and function to a conventional small outline j-bend (SOJ) semiconductor package. As will be further explained, an electrical path can be established between the conductors 34 on the base 22 and the interconnect 24 mounted to the base 22 by wire bonding, by TAB tape, or with mechanical-electrical connectors. The base 22 also includes openings 38B that permit the cover 26 to be attached to the base 22.

Still referring to FIG. 2, once the temporary package 14 has been assembled, the temporary package 14 is placed in the testing apparatus 16. The testing apparatus 16 is similar in design and function to a standard burn-in board for burning-in conventional semiconductor packages, but with a defect correction capability. The testing apparatus 16 is adapted to establish electrical communication with a plurality of packages 14 and to mount the packages 14 within a burn-in oven. The testing apparatus 16 includes a plurality of electrical sockets (not shown) each of which is adapted to retain and electrically connect to the terminal contacts 36 on a corresponding package 14.

The testing apparatus 16 also includes, or is in electrical communication with testing circuitry 40, and with programming circuitry 42. The testing circuitry 40 is adapted to apply test signals to the integrated circuits 20A, 20B on the die 12. The programming circuitry 42 is adapted to apply programming signals to the programmable links 18A, 18B. In the case of programmable links 18A, 18B formed as fuses or anti-fuses, the programming signals can be applied as voltages configured to disable the fuses or enable the anti-fuses.

Figure 3:
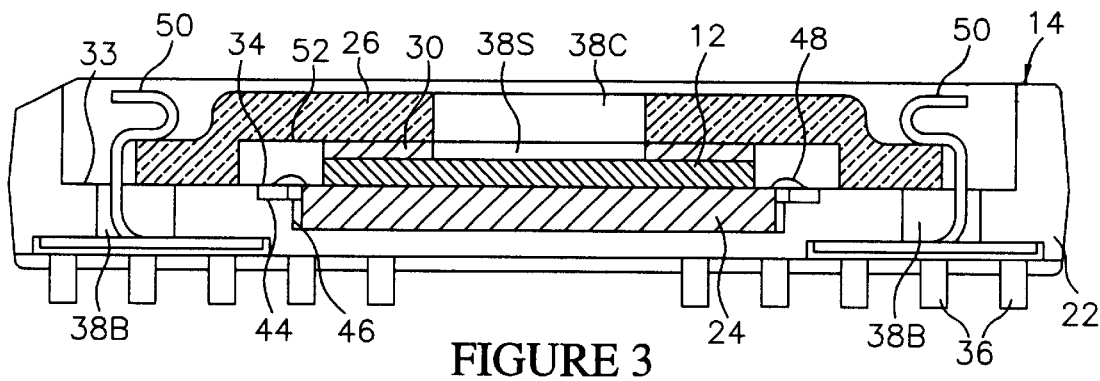
FIG. 3 is a cross sectional view of a temporary package suitable for use in making known good semiconductor dice in accordance with the invention.
Figure 4:
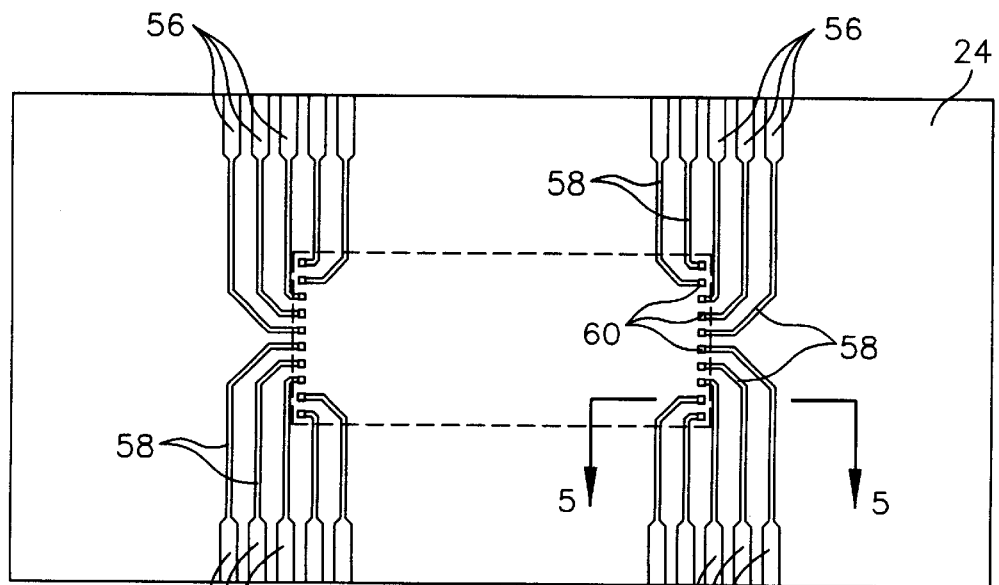
FIG. 4 is a plan view of an interconnect for the temporary package shown in FIG. 3.
Figure 5A:
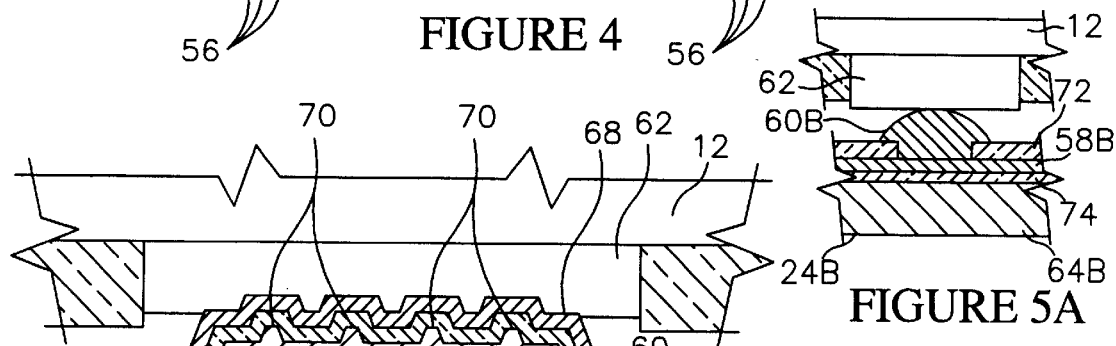
FIG. 5A is an enlarged cross sectional view equivalent to FIG. 5 of an alternate embodiment interconnect for the temporary package shown in FIG. 3.
Figure 5:
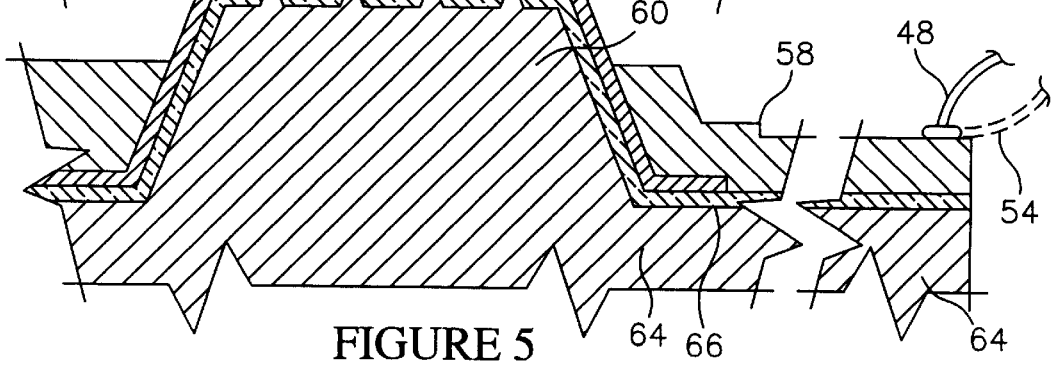
FIG. 5 is an enlarged cross sectional view taken along section line 5—5 of FIG. 4.

Referring to FIGS. 3–5, further details of the temporary package 14 are illustrated. As shown in FIG. 3, in the assembled temporary package 14, the die 12 can be held within the recess 33, sandwiched between the interconnect 24 and the cover 26. The interconnect 24 can be mounted within a second recess 46 formed within the package base 14. As also shown in FIG. 3, in the assembled package 14, the spring member 30 can press the die 12 against the interconnect 24. The spring member 30 can be formed of an elastomeric material such as silicone, butyl rubber, or fluorosilicone; in foam, gel, solid or molded configurations. Suitable elastomeric materials include "PORON" available from Rogers or "BISCO" available from a Dow Chemical subsidiary.

With the spring member 30 formed of an elastomeric material, the pressure plate 28 (FIG. 2) can be omitted so that the spring member 30 bears directly against the die 12. The spring member 30 can also be formed of a metal in the form of a wave washer, bellview spring, or similar configuration. In this case, the pressure plate 28 (FIG. 2) would preferably be located between the spring member 30 and the die 12.

Still referring to FIG. 3, clips 50 are slideably attached to the openings 38B formed in the package base 22. The clips 50 function to secure the cover 26, spring member 30, and die 12 to the package base 22. The clips 50 can be formed of a resilient material such as spring steel, or plastic, and are shaped to exert a retention force on the cover 26.

Furthermore, the cover 26 can include an indentation 52 for the spring member 30 and die 12. In the assembled package 14, the cover 26 can be recessed below a top surface of the package base 22. The outer peripheral size and outline of the package 14 can thus be substantially determined by the outer peripheral size and outline of the package base 22. Advantageously, the outline of the package can be substantially equivalent to a conventional plastic or ceramic semiconductor package. This permits the temporary package 14 to be used with standardized burn-in equipment for a conventional semiconductor package.

As used herein, the term "conventional semiconductor package" refers to a plastic or ceramic package having a size and external lead configuration that conforms to standards of a recognized industry standard setting body. These standard setting bodies can include:

EIA/JEDEC—Electronics Industry Association—Joint Electron Device Engineering Council JEIDA—Japanese Electronics Industry Development Association PCMCIA—Personal Computer Memory Card International Association Further details of the temporary package 14 are disclosed in U.S. Pat. No. 6,815,000 incorporated herein by reference.

Referring to FIG. 4, the interconnect 24 for the temporary package 14 is shown separately. The interconnect 24 includes bonding pads 56 that can be electrically connected to the conductors 34 (FIG. 3) on the base 14. The interconnect 24 also includes conductive traces 58 and raised contact members 60. As shown in FIG. 5, each raised contact member 60 is adapted to contact and establish an electrical connection with a device bond pad 62 (or other contact location) on the die 12. In addition, the raised contact members 60 can include penetrating projections 70 formed as elongated blades adapted to penetrate the device bond pads 62 to a self limiting penetration depth.

The interconnect 24 and raised contact members 60 can be formed by etching a silicon substrate 64. Following etching of the contact members 60, an insulating layer 66 is formed over the entire substrate. In addition, a conductive layer 68 is formed on each raised contact member 60. The conductive layers 68 are in electrical communication with the conductive traces 58. The conductive traces 58 can be wire bonded to bond wires 48 (FIG. 3) which are also wire bonded to the conductors 34 (FIG. 3) on the package base 22 to provide a conductive path to and from the contact members 60. Alternately, in place of wire bonding, an electrical path can be formed to the conductive traces 58 with non-bonded mechanical electrical contacts 54 (FIG. 5) such as clips or slide contacts. Tab tape (not shown) can also be utilized to electrically connect the conductors 34 (FIG. 3) on the base 22 to the conductive traces 58 (FIG. 4) on the interconnect 24.

A suitable process for forming the interconnect 24 and contact members 60 substantially as shown in FIGS. 4 and 5 is disclosed in U.S. Pat. Nos. 5,326,428 and 5,419,807 which are incorporated herein by reference. The contact members 60 can also be configured to penetrate bond pads on a bumped die (not shown). U.S. Pat. No. 5,592,736 incorporated herein by reference, discloses a method for forming a contact member for bumped dice.

With reference to FIG. 5A, the interconnect 24B can also be formed with microbump contact members 60B and conductive traces 58B formed on a plastic film 72. The microbump contact members 60B and plastic film 72 can be similar to multi layered TAB tape such as "ASMAT" manufactured by Nitto Denko. The plastic film 72 can be mounted to an interconnect substrate 64B using a compliant adhesive layer 74. The compliant adhesive layer 74 can be formed of a silicone elastomer, an epoxy or a polyimide material. One method for forming an interconnect with microbump contact members is described in U.S. Pat. No. 5,678,301 incorporated herein by reference.

Referring to FIGS. 11 and 12 an alternate embodiment temporary package 14A is shown. The alternate embodiment temporary package 14A is substantially equivalent in function to the temporary package 14 (FIG. 3) previously described. The temporary package 14A includes a base 22A, an interconnect 24 mounted to the base 22A, a pressure plate 28A, a spring member 30A, a cover 26A, and a pair of clips 50A. Each of these components functions substantially the same as the equivalent components previously described for temporary package 14 (FIG. 3). In particular the base 22A is adapted to retain the die 12, the interconnect 24 is adapted to establish temporary electrical communication with the die 12, and the pressure plate 28A, spring member 30A and cover 26A comprise a force applying mechanism for pressing the die 12 against the interconnect 24.

The base 22A can be formed of plastic or a laminated ceramic substantially as previously described for base 22 (FIG. 3). The base 22A can include conductors (not shown) and terminal contacts (not shown) that are substantially equivalent to the conductors 34 (FIG. 3) and terminal contacts 36 (FIG. 3) previously described for temporary package 14. In addition, the base 22A can include a bonding shelf 158 wherein the conductors are location, and a through opening 160 for assembling the interconnect 24 on the base 22A. In the assembled package 14A, the base 22A is adapted to retain the interconnect 24 in electrical communication with the terminal contacts on the base 22A. An electrical path between the interconnect 24 and the base 22A can be formed by bond wires 48, TAB tape (not shown) or mechanical-electrical connectors (not shown) as previously described.

The base 22A can also include a clip mount portion 152, having slots or other members, configured to slidably receive and retain the clips 50A. The clip mount portion 152 can be formed as a separate member that is attached to the base 22A. Alternately, the clip mount portion 152 can be formed integrally with the base 22A. The base 22A can also include a separate base plate 150 for closing the opening 160 and mounting the interconnect 24. The base plate 150 can be formed as a metal, plastic or ceramic plate that is attached to the base 22A. Depending on the materials used for the base 22A and base plate 150, the base plate 150 can be attached to the base 22A using an adhesive bonding process, a soldering process or a brazing process.

Still referring to FIG. 11, the cover 26A can be formed as a metal or plastic member having shaped end portions 162 configured for mating engagement with the clips 50A. The cover 26A can also include an opening 38C that functions as previously described for assembling and disassembling the temporary package 14A. In addition, the cover 26A can be sized to fit within a stepped recess 154 formed on the base 22A.

The spring member 30A can be formed of an elastomeric material, such as silicone, butyl rubber, or fluorosilicone, as previously described for spring member 30. In addition, the spring member 30A can include an opening 38S that functions as previously described for assembling and disassembling the temporary package 14A. The spring member 30A can be attached to the cover 26A using an adhesive 156, such as an epoxy or silicone elastomer. One suitable adhesive is "ZYMET" silicone elastomer manufactured by Zymet, Inc., East Hanover N.J. The spring member 30A can also be attached to the pressure plate 28A using the same adhesive 156. An opening 38P formed in the pressure plate functions as previously described for assembling and disassembling the temporary package 14A.

Referring to FIG. 12, in the assembled temporary package 14A the die 12 is sandwiched between the interconnect 24 and the pressure plate 28A. The cover 26A is secured to the stepped recess 154 by the clips 50A. In addition, the spring member 30A presses the die 12 against the interconnect 24 so that the contact members 60 (FIG. 5) on the interconnect 24 electrically contact the device bond pads 60 (FIG. 5).

Figure 6:
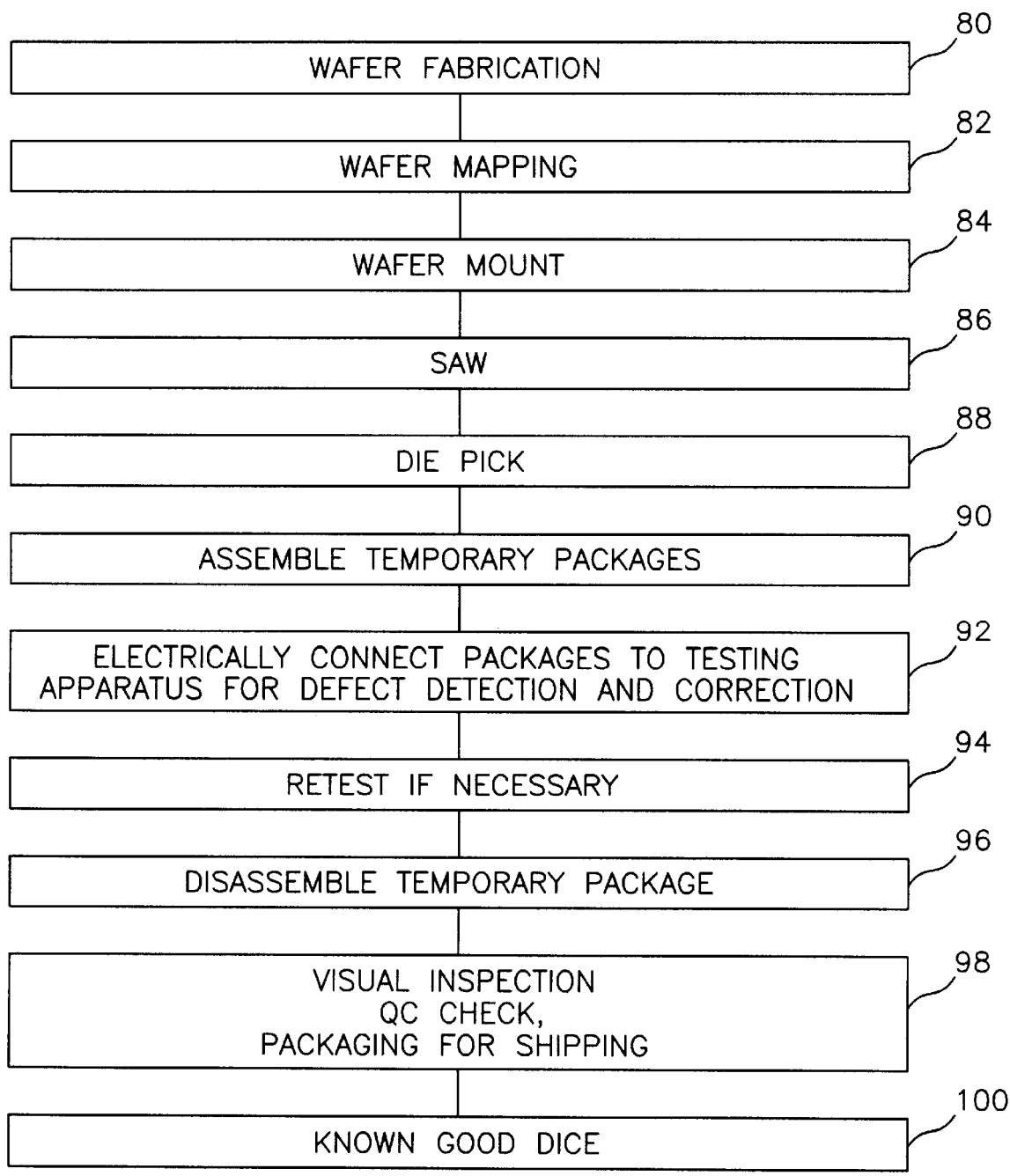
FIG. 6 is a flow diagram of a process flow for making known good semiconductor dice in accordance with the invention.

Referring to FIG. 6, a process flow for making known good semiconductor dice 12 in accordance with the invention is shown. During a semiconductor manufacturing process a wafer is fabricated with a large number of dice 12, step 80. The wafer is formed by patterning and doping a semiconducting substrate and then depositing, patterning and etching various layers of material on the substrate to form integrated circuits. Each die 12 includes programmable links 18A, 18B (FIG. 2) and redundant or programmable integrated circuits 20A, 20B as previously described.

Following wafer fabrication, the wafer is mapped, step 82. During wafer mapping, the wafer is subjected to probe testing to ascertain the gross functionality of the dice 12 contained on the wafer. Typically a wafer prober apparatus is used for wafer mapping. During wafer mapping, each die 12 can be given a brief test for functionality, and the nonfunctional dice can be mechanically marked or mapped in software. Wafer mapping can also include various functional and parametric tests of each die. Also during wafer mapping defects that have been detected can be corrected by programming circuitry associated with the wafer probe apparatus. However, at this point the dice 12 have been not been burned-in so that some types of defects are not yet detectable.

Following wafer mapping, the wafer containing the dice 12 is mounted on a flexible carrier film, step 84. The carrier film is covered with an adhesive material for retaining and supporting the wafer for transport and sawing. The wafer is then sawed utilizing a diamond tipped saw, step 86, which separates the dice along scribe lines. This singulates the dice formerly contained on the wafer into discrete bare dice 12.

Next, the bare dice 12 having an acceptable gross functionality are picked up one at a time utilizing a suitable manual or automated apparatus, step 88. With an automated method of die pick, information gained during the wafer probe is used to direct an assembly tool to the mapped dice.

Next, the dice 12 are assembled into the temporary packages 14, step 90. Each temporary package 14 can be assembled using optical alignment techniques and aligner bonder tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al., entitled "Aligner Bonder". Such an aligner bonder is available from Research Devices of Piscataway, N.J.

U.S. Pat. No. 5,634,267 incorporated herein by reference, describes an automated apparatus suitable for picking and optically aligning the die 12 and interconnect 24 and then assembling the temporary package 14.

Following assembly of the temporary package, the temporary packages 14 are electrically connected to the testing apparatus 16 for testing and defect correction, step 92. Testing can include full functionality testing as well as burn-in testing at elevated temperatures. In addition, defects on the die 12 can be corrected as previously described by selective actuation of the programmable links 18A, 18B.

Dice 12 that have been rehabilitated using the defect correction process can be then retested and reburned-in, if necessary step 94. Advantageously the defective dice 12 can remain in the same assembled temporary package 14 during retest. However, the retest and reburn-in is optional as some types of rehabilitated dice will not require retesting and reburning-in. For example, redundant integrated circuitry can be configured for testing during the initial testing process and burn-in. In this case, retest and reburn-in after enabling the redundant circuitry is not required.

Following the testing, (and retest if necessary) the temporary package 14 can be disassembled, step 96. For disassembling the temporary package 14, an assembly tool (not shown) can be used to remove the clips 50 (FIG. 3) and remove the die 12 from the package 14.

Following the disassembly step, the tested die 12 can be placed in a tray or other holder and can be subjected to a visual inspection, to a quality control check and then packaged for shipping, step 98. Using this process the die has been certified as a known good die, step 100.

Figure 7:
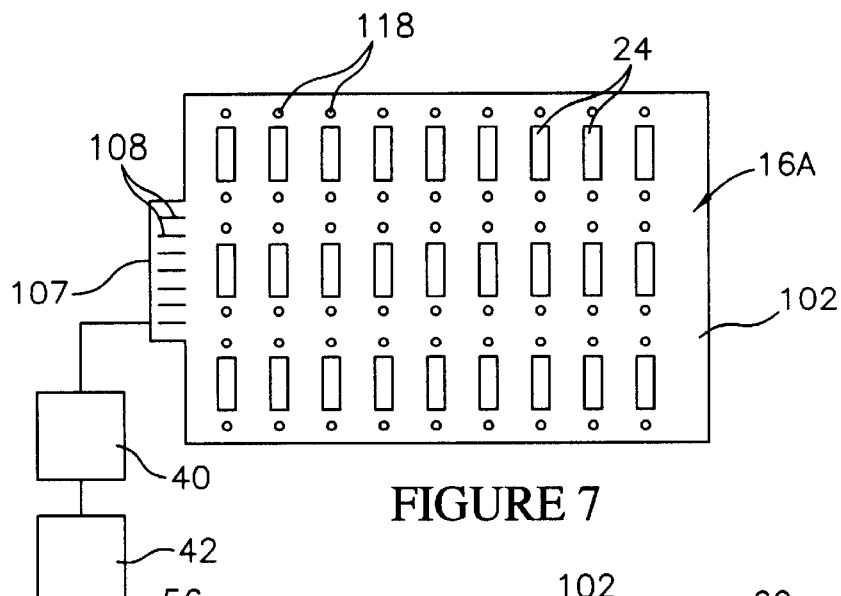
FIG. 7 is a schematic plan view of an alternate embodiment testing apparatus for making known good semiconductor dice in accordance with the invention.
Figure 8:
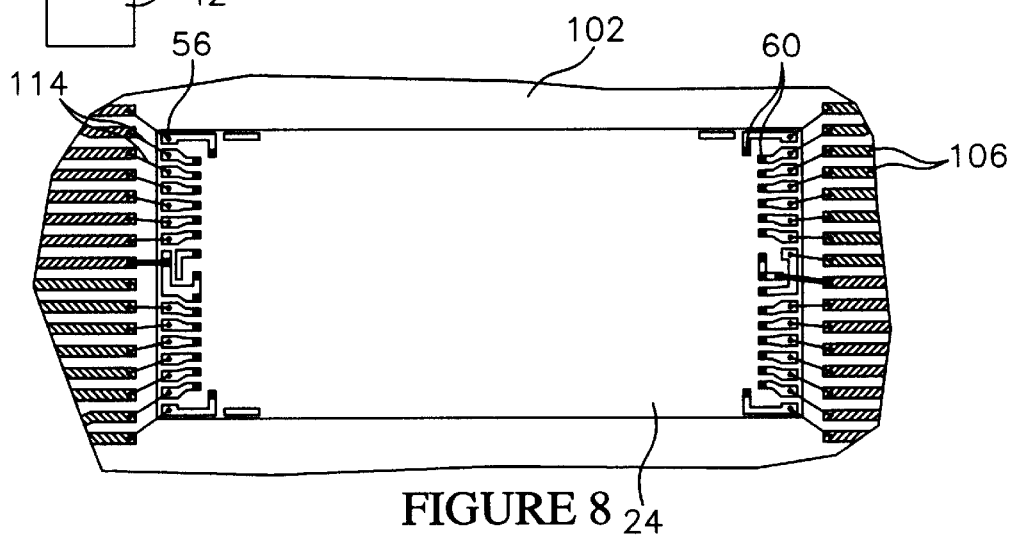
FIG. 8 is an enlarged plan view with parts removed of the testing apparatus of FIG. 7 illustrating an interconnect component.
Figure 9:
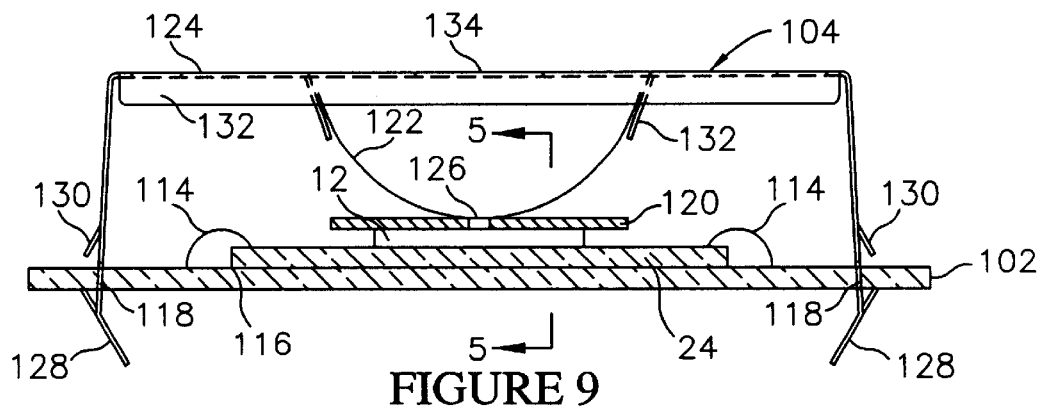
FIG. 9 is a cross sectional view of the testing apparatus of FIG. 7 illustrating a test board and a force applying mechanism.

Referring to FIGS. 7–9, an alternate embodiment system for making known good semiconductor dice in accordance with the invention is shown. The system includes a testing apparatus 16A in the form of a board 102; a plurality of interconnects 24 mounted to the board 102; and a plurality of force applying mechanisms 104 (FIG. 9) for biasing the dice 12 (FIG. 9) against the interconnects 24.

The board 102 can be formed of an electrically insulating material similar to those used to form printed circuits boards. Suitable materials include FR-4 board, glass filled plastics and ceramics. The board includes a plurality of patterns of conductors 106 (FIG. 8). Each interconnect 24 on the board 102 has an associated pattern of conductors 106. The conductors 106 have terminal portions 108 (FIG. 7) in electrical communication with an external connector 110 (FIG. 7). The external connector 110 can be formed as a male or female electrical connector adapted for mating engagement with a corresponding male or female member.

The board 102 is adapted for placement in a chamber with temperature cycling capabilities, such as a burn-in oven. In addition, the external connector 110 is adapted for electrical connection to testing circuitry 40 and programming circuitry 42 that function substantially as previously described. Specifically the testing circuitry 40 is adapted to apply test signals for testing the dice 12 and detecting defects. The programming circuitry 42 is adapted to apply programming signals for programming the programmable links 18A, 18B (FIG. 2) to correct the defects. Alternately in place of programming circuitry, the board 102 can be operatively associated with a laser adapted to program programmable links 18A, 18B formed as laser programmable links. In this case a portion of the surface of the die 12 wherein the programmable links 18A, 18B are located must be exposed to the laser.

Each interconnect 24 on the board 102 is adapted to establish temporary electrical communication with a semiconductor die 12. An electrical path can be established between each interconnect 24 and corresponding patterns of conductors 106 (FIG. 8) on the board 102 by bond wires 114. The bond wires 114 can be wire bonded to the conductors 106 (FIG. 8) and to bonding pads 56 (FIG. 8) on associated conductors 58 (FIG. 8) formed on the interconnects 24. The conductors 58 on the interconnects 24 are in electrical communication with contact members 60 (FIG. 8) formed on the interconnects 24 substantially as previously described. The contact members 60 are adapted to establish temporary electrical communication with the device bond pads 62 (FIG. 5) also substantially as previously described.

The bond wires 114 not only establish an electrical connection between the interconnects 24 and the board 102 but also help to secure the interconnects 24 to the board 102. An adhesive 116 (FIG. 9) can also be used to secure the interconnects 24 to the board 102.

As shown in FIG. 9, a force applying mechanism 104 can be operatively associated with each interconnect 24 to bias a corresponding die 12 against the interconnect 24. The force applying mechanisms 104 attach to pairs of openings 118 formed through the board 102. Each force applying mechanism 104 can include a pressure plate 120, a spring 122 and a bridge clamp 124.

The pressure plate 120 functions to evenly distribute the load applied by the spring 122. In addition, the pressure plate 120 functions to dissipate heat from the die 12 during the test procedures. However, a force applying mechanism 104 can also be constructed without the pressure plate 120.

The spring 122 of the force applying mechanism 104 can be formed of an elastically resilient material such as spring steel. The spring 122 can be sized and shaped to exert a predetermined spring force on the pressure plate 120. This force is evenly distributed by the pressure plate 120 over the back surface of the die 12 and biases the die 12 against the interconnect 24. The spring 122 and pressure plate 120 can also be formed with openings 126 that permit access for an assembly tool.

Still referring to FIG. 9, the bridge clamp 124 can be a flexible structure formed of a resilient material such as steel. The bridge clamp 124 can include mounting tabs 128 adapted for placement through the openings 118 in the board 102. The structure of the mounting tabs 128 and the bridge clamp 124 under tensioning from the spring 122 cooperate to secure the bridge clamp 124 to the board 102. Another set of tabs 130 can be formed on the bridge clamp 124 to limit the downward movement of the bridge clamp 124.

The bridge clamp 124 can also includes downwardly extending tabs 132 for attaching the spring 122 to the bridge clamp 124 by physical contact or a fastening mechanism such as spot welds. The longitudinal upper edges of the bridge clamp 124 can be bent at a 90° angle to form stiffener members 132 on either side. In addition, a central opening 134 can be formed in the bridge clamp 124 to permit access for an assembly tool.

During an assembly procedure, the raised contact members 60 (FIG. 8) on the interconnects 24 can be aligned with the device bond pads 62 (FIG. 5) on the die 12 using optical alignment techniques and an aligner bonder tool. At the same time an assembly tool can be used to secure the bridge clamp 124 to the board 102. Such an alignment and assembly process is described in the previously incorporated U.S. Pat. No. 5,634,267.

The system depicted in FIGS. 7–9 functions substantially the same as the system 10 previously described. However, as is apparent the dice 12 are not individually packaged in temporary packages 14 but are mounted directly to the board 102. The board 102 thus performs both the function of the temporary packages 14 and the function of the testing apparatus 16 previously described.

Figure 9A:
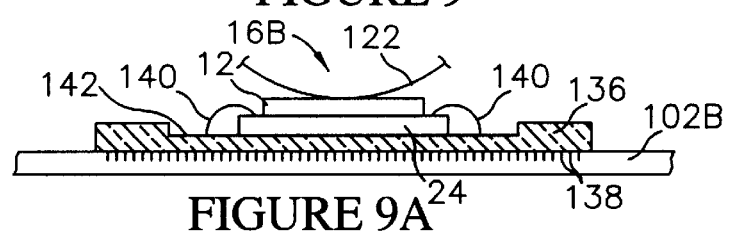
FIG. 9A is a schematic cross sectional view, equivalent to FIG. 9, illustrating an alternate embodiment testing apparatus having a socket for electrically engaging the interconnect.

FIG. 9A illustrates another alternate embodiment testing apparatus 16B similar to the testing apparatus 16A shown in FIG. 7. Testing apparatus 16B includes a board 102B that functions substantially the same as the board 102 (FIG. 7) previously described. However, in this case a socket 136 is mounted to the board 102B and the interconnect 24 is electrically connected to the socket 136 rather than being wire bonded to the board. The socket 136 can include electrical connectors 138 that establish electrical communication with the board 102B. In addition, the socket 136 can include a recess 142 for retaining the interconnect 24 and electrical connectors 140 such as electrical clips, that establish electrical communication with the interconnect 24. A force applying mechanism operatively associated with the board 102B substrate as previously described can include a spring 122 for biasing the die 12 against the interconnect 24.

Figure 10:
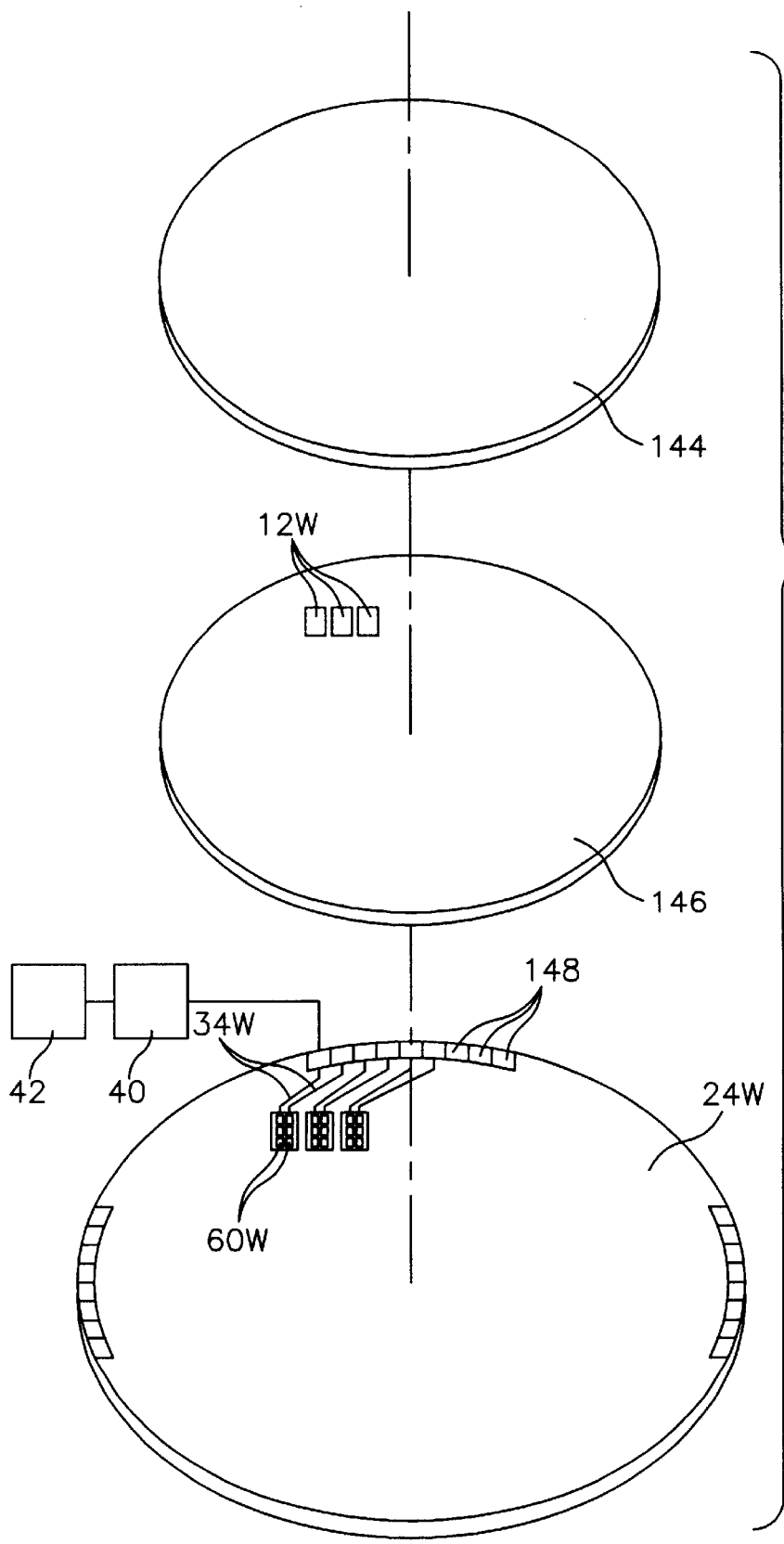
FIG. 10 is a schematic perspective view of a wafer level system for making known good semiconductor dice in accordance with the invention.

Referring to FIG. 10, a wafer level system 10W for testing an entire semiconductor wafer 146 is shown. The wafer level system 10W includes a semiconductor wafer 146; a wafer interconnect 24W for establishing electrical communication with the wafer 146; and a force applying member 144 for biasing the wafer 146 against the wafer interconnect 24W.

The wafer 146 includes a plurality of semiconductor dice 14W. The wafer 146 and dice 14W can be fabricated substantially as previously described but without being singulated.

The wafer interconnect 24W functions substantially as previously described for interconnect 24 to establish temporary electrical communication with contact locations on the wafer 146 for testing and defect correcting. The wafer interconnect 24W can be formed of an etchable material, such as silicon, and includes a plurality of contact members 60W. The contact members 60W can be formed substantially as previously described for the contact members 60 (FIG. 5). The contact members 60W can be formed on the wafer interconnect 24W in patterns that match the patterns of the bond pads 62 (FIG. 5) or other contact locations on the semiconductor dice 14W. In addition, the contact members 60W can be formed in electrical communication with conductors 34W formed on the wafer interconnect 24W. The conductors 34W can include contact pads 148 that allow an electrical path to be formed between the contact members 60W and testing circuitry 40 and programming circuitry 42. The electrical path to the contact pads 148 can be formed by wire bonds, TAB tape or mechanical electrical connectors.

The wafer interconnect 24W can be sized for placement in a wafer package (not shown) adapted to temporarily package a single wafer 146 substantially as previously described for the temporary package 14. Alternately, the wafer interconnect 24W can be formed as a board adapted to surface mount one or more wafers 146 substantially as previously described for board 102.

The force applying member 144 can be constructed as an elastomeric material, such as silicone, butyl rubber, or fluorosilicone, substantially as previously described. Alternately, the force applying member 144 can be constructed as a compressible bladder. This type of compressible bladder is available from Paratech of Frankfort, IL under the trademark "MAXI FORCE AIRBAG". A clipping or latching mechanism (not shown) can be used to secure the force applying member 144 to the wafer interconnect 24W substantially as previously described for the force applying mechanism 104 (FIG. 9). In this case, a wafer signal pressure plate substantially equivalent to pressure plate 126 (FIG. 9) can be configured to bias the force applying member 144 against the wafer 146.

Alignment of the wafer 146 with the wafer interconnect 24W can be with optical alignment as previously described. Alternately a mechanical aligner (not shown) can be used to align the wafer 146 with the wafer interconnect 24W. The wafer level system 10W can be used to detect defects in the dice 34W and to correct the defects substantially as previously described for system 10 (FIG. 7).

Thus the invention provides an improved method and system for making known good semiconductor dice. While the invention has been described with reference to certain preferred embodiments, as will be apparent to those skilled in the art, certain changes and modifications can be made without departing from the scope of the invention as defined by the following claims.

What is claimed is:

1. A method for making semiconductor dice, comprising:
   providing a semiconductor die comprising an integrated circuit and a programmable link in electrical communication with the integrated circuit;
   assembling the die in a temporary package;
   applying a test signal to the die held in the temporary package to detect a defect in the integrated circuit; and
   applying a programming signal to the die held in the temporary package to actuate the programmable link to correct the defect.

2. The method of claim 1 further comprising providing the die with a second programmable link in electrical communication with a second integrated circuit and activating the second integrated circuit by applying a second programming signal to the second programmable link.

3. The method of claim 1 wherein the die comprises a chin scale package.

4. The method of claim 1 wherein the programmable link comprises an anti fuse.

5. The method of claim 1 wherein applying the test signal is performed during burn-in testing.

6. The method of claim 1 wherein the temporary package comprises an interconnect for establishing temporary electrical communication with the die and the test signal and the programming signal are applied through the interconnect to the die.

7. A method for making semiconductor dice, comprising:
   providing a semiconductor die comprising a first integrated circuit in electrical communication with a first programmable link and a second integrated circuit in electrical communication with a second programmable link;
   assembling the die in a temporary package to form a temporarily packaged die;
   testing the temporarily packaged die by applying a test signal to the first integrated circuit to detect a defect;
   correcting the defect by applying a first programming signal to the first programmable link to disable the first integrated circuit, and by applying a second programming signal to the second programmable link to activate the second integrated circuit; and
   disassembling the temporary package.

8. The method of claim 7 further comprising following the correcting step, but prior to the disassembling step, applying a second test signal to the second integrated circuit.

9. The method of claim 7 wherein the first programmable link comprises a fuse.

10. The method of claim 7 wherein the second programmable link comprises an anti fuse.

11. The method of claim 7 wherein the temporary package is configured to retain a semiconductor wafer with the die contained therein.

12. The method of claim 7 wherein the testing step comprises burn-in testing performed at an elevated temperature.

13. The method of claim 7 wherein the die comprises a chip scale package.

14. A method for making semiconductor dice comprising:
   providing a semiconductor die comprising a plurality of integrated circuits in electrical communication with a plurality of programmable links;
   placing the die in contact with an interconnect having a plurality of contact members configured to establish temporary electrical communication with the integrated circuits;
   applying test signals through at least some of the contact members to the integrated circuits to detect a defect; and
   applying a programming signal through a selected contact member to a selected programmable link to correct the defect.

15. The method of claim 14 wherein the interconnect comprises a testing apparatus comprising a plurality of interconnects configured to test a plurality of dice.

16. The method of claim 14 wherein the interconnect comprises a temporary package configured to retain the die.

17. The method of claim 14 wherein the die comprises a chip scale package.

18. The method of claim 14 further comprising, following applying of the programming signal, applying second test signals to the integrated circuits.

19. The method of claim 14 wherein applying the test signal is performed at an elevated temperature.

20. A method for making semiconductor dice, comprising:
providing a semiconductor die comprising a plurality of integrated circuits in electrical communication with a plurality of first programmable links, and a redundant integrated circuit in electrical communication with a second programmable link;
assembling the die in a temporary package;
testing the integrated circuits by applying test signals through the temporary package to the integrated circuits to detect a defective integrated circuit;
applying a first programming signal through the temporary package to a selected first programmable link to disable the defective integrated circuit;
applying a second programming signal through the temporary package to the second programmable link to activate the redundant integrated circuit; and
disassembling the die from the temporary package.

21. The method of claim 20 and further comprising prior to disassembling the die, applying a second test signal through the temporary package to the redundant integrated circuit.

22. The method of claim 20 further comprising applying a second test signal to the redundant integrated circuit prior to applying the second programming signal.

23. The method of claim 20 wherein the temporary package is configured to retain a single die.

24. The method of claim 20 wherein the temporary package is configured to retain a semiconductor wafer having the die formed thereon.

25. The method of claim 20 wherein the die comprises an element selected from the group consisting of bare dice, bumped dice and chip scale packages.

26. A method for making semiconductor dice comprising:
providing a semiconductor die comprising a first integrated circuit in electrical communication with a first programmable link and a second integrated circuit in electrical communication with a second programmable link;
providing a test apparatus configured to applying test signals to the first integrated circuit and to apply programming signals to the first programmable link and to the second programmable link:
placing the die in electrical communication with an interconnect comprising a first contact member configured to establish electrical communication with the first programmable link and a second contact member configured to establish electrical communication with the second programmable link;
applying a test signal through the first contact member to the first integrated circuit to detect a defect;
applying a first programming signal through the first contact member to the first programmable link to disable the first integrated circuit; and
applying a second programming signal through the second contact member to the second programmable link to activate the second integrated circuit.

27. The method of claim 26 wherein the interconnect comprises a temporary package for housing the die.

28. The method of claim 26 wherein the interconnect is mounted to a board containing a plurality of interconnects.

29. The method of claim 26 wherein the first contact member comprises penetrating projections configured to penetrate into a contact location on the die to a limited penetration depth.

30. The method of claim 26 wherein the first contact member comprises a metal microbump formed on a flexible tape.

31. A method for making semiconductor chip scale packages comprising:
providing a semiconductor die comprising a first integrated circuit in electrical communication with a first programmable link and a second integrated circuit in electrical communication with a second programmable link;
packaging the die in a chin scale package;
providing a testing apparatus comprising an interconnect comprising a first contact adapted to establish temporary electrical communication with the first programmable link and a second contact adapted to establish temporary electrical communication with the second programmable link;
placing the chip scale package on the interconnect with the first contact in electrical communication with the first programmable link and the second contact in electrical communication with the second programmable link;
applying test signals through the first contact to the first integrated circuit to detect a defect; and
correcting the defect by applying a first programming signal to the first programmable link to disable the first integrated circuit and by applying a second programming signal to the second programmable link to activate the second integrated circuit.

32. The method of claim 31 further comprising following the correcting step applying test signals through the second contact to the second integrated circuit.

33. The method of claim 31 wherein the testing apparatus comprises a force applying member for biasing the chip scale package against the interconnect.

34. The method of claim 31 wherein the testing apparatus comprises a temporary package.

35. The method of claim 31 wherein the testing apparatus comprises a board with a plurality of interconnects.

36. A system for making semiconductor dice comprising:
a semiconductor die comprising a first integrated circuit in electrical communication with a first programmable link and a second integrated circuit in electrical communication with a second programmable link;
an interconnect comprising a first contact member configured to establish temporary electrical communication with the first programmable link and a second contact member configured to establish temporary electrical communication with the second programmable link; and
a testing apparatus configured to apply test signals through the first contact member to the integrated circuit to detect a defects to apply a first programming signal through the first contact member to the first programmable link to disable the first integrated circuit, and to apply a second programming signal through the second contact member to activate the second integrated circuit.

37. The system of claim 36 wherein the interconnect is mounted to a board comprising a plurality of interconnects.

38. The system of claim 36 wherein the interconnect comprises a temporary package configured to retain the die.

39. The system of claim 38 wherein the temporary package has an outline substantially equivalent to a conventional ceramic or plastic semiconductor package.

40. The system of claim 38 wherein the temporary package comprises an elastomeric member configured to press the die against the interconnect.

41. The system of claim 36 wherein the interconnect is configured to establish electrical communication with a plurality of dice contained on a semiconductor wafer.

42. A system for making a semiconductor chip scale package comprising:
a semiconductor die contained within the chip scale package, the die comprising a first integrated circuit in electrical communication with a first programmable link, and a second integrated circuit in electrical communication with a second programmable link;
a temporary package configured to house the chip scale package for testing and to establish temporary electrical communication with the first integrated circuit, the second integrated circuit, the first programmable link, and the second programmable link; and
a testing apparatus configured to retain the temporary package in electrical communication with test circuitry for applying test signals to the first integrated circuit to detect a defect and in electrical communication with programming circuitry for applying a first programming signal to the first programmable link to disable the first integrated circuit, and for applying a second programming signal to the second programmable link to activate the second integrated circuit.

43. The system of claim 42 wherein the temporary package comprises a base for retaining the chip scale package, an interconnect for establishing temporary electrical communication with the chip scale package, and a force applying mechanism for pressing the chip scale package against the interconnect.

44. The system of claim 43 wherein the force applying mechanism comprises an elastomeric spring, a cover, and a clip.

45. The system of claim 44 wherein the clip slidably attaches to a clip mount portion of the base.

46. The system of claim 45 and wherein elastomeric spring comprises a material selected from the group consisting of silicone, butyl rubber and fluorosilicone.

47. The system of claim 46 wherein the elastomeric spring comprises an adhesive attached to the cover.

48. A system for making semiconductor dice comprising:
a semiconductor die comprising a plurality of integrated circuits in electrical communication with a plurality of programmable links;
a testing apparatus comprising an interconnect with a plurality of contact members configured to establish temporary electrical communication with the integrated circuits and programmable links;
a test circuit in electrical communication with the contact members configured to apply test signals through the contact members to the integrated circuits to detect a defect; and
a programming circuit in electrical communication with the contact members configured to apply programming signals through selected contact members to selected programmable links to correct the defect.

49. The system of claim 48 wherein the testing apparatus comprises a board with a plurality of interconnects each configured to establish electrical communication with a single die.

50. The system of claim 49 wherein the testing apparatus comprises a plurality of force applying mechanisms associated with the plurality of interconnects.

51. The system of claim 48 further comprising a burn-in oven adapted to heat the die to an elevated temperature.

52. The system of claim 48 wherein the testing apparatus comprises a board configured to retain a plurality of dice contained in temporary packages.

53. The system of claim 52 wherein the temporary package has an outline substantially equivalent to a conventional plastic or ceramic semiconductor package.

54. The system of claim 48 wherein the die comprises an element selected from the group consisting of bare dice, bumped dice and chip scale packages.

55. A system for making semiconductor dice comprising:
a semiconductor wafer comprising at least one semiconductor die comprising a first integrated circuit in electrical communication with a first programmable link and a second integrated circuit in electrical communication with a second programmable link;
an interconnect comprising a first contact member configured to establish temporary electrical communication with the first programmable link and a second contact member configured to establish electrical communication with the second programmable link;
a testing circuit configured to apply test signals through the first contact member to the first integrated circuit to detect a defect; and
a programming circuit configured to apply a first programming signal through the first contact member to the first programmable link to disable the first integrated circuit, and to apply a second programming signal through the second contact member to the second programmable link to activate the second integrated circuit.

56. The system of claim 55 wherein the interconnect comprises a board with the first contact member and the second contact member formed thereon.

57. The system of claim 55 wherein the interconnect is mountable to a board in electrical communication with a socket on the board.

58. The system of claim 55 further comprising a force applying member for biasing the wafer against the interconnect.

59. The system of claim 58 wherein the force applying member comprises an elastomeric material.

60. The system of claim 58 wherein the force applying member comprises a compressible bladder.

* * * * *

UNITED STATES PATENT AND TRADEMARK OFFICE
CERTIFICATE OF CORRECTION

PATENT NO.    : 6,258,609 B1  
DATED         : July 10, 2001  
INVENTOR(S)   : Warren M. Farnworth, Alan G. Wood Page 1 of 1

It is certified that error appears in the above-identified patent and that said Letters Patent is hereby corrected as shown below:

Column 12, claim 3,
Line 12, change "chin" to -- chip --.

Column 14, claim 31,
Line 22, change "chin" to -- chip --.

Column 14, claim 36,
Line 65, change "defects" to -- defect --.

Column 15, claim 46,
Line 49, after "wherein" add -- the --.

Signed and Sealed this

Twenty-ninth Day of January, 2002

Attest:

JAMES E. ROGAN
*Attesting Officer*   *Director of the United States Patent and Trademark Office*